United States Patent [19]

Anderson

[11] Patent Number: 5,493,246
[45] Date of Patent: Feb. 20, 1996

[54] CIRCUIT AND METHOD OF CANCELING LEAKAGE CURRENT IN AN ANALOG ARRAY

[75] Inventor: David J. Anderson, Scottsdale, Ariz.

[73] Assignee: Motorola, Inc., Schaumburg, Ill.

[21] Appl. No.: 300,906

[22] Filed: Sep. 6, 1994

[51] Int. Cl.[6] .................................................. H03K 17/16
[52] U.S. Cl. .......................... 327/382; 327/307; 327/52; 327/65; 327/378
[58] Field of Search ................................ 327/52, 53, 65, 327/66, 307, 341, 362, 379, 526, 560, 382, 378; 330/9

[56] References Cited

U.S. PATENT DOCUMENTS

| | | | |
|---|---|---|---|
| 4,163,947 | 8/1979 | Weedon | 327/307 |
| 4,216,394 | 8/1980 | Leidich | 327/540 |
| 4,555,668 | 11/1985 | Gregorian et al. | 330/9 |
| 4,885,548 | 12/1989 | Wakimoto et al. | 330/260 |
| 4,988,900 | 1/1991 | Fensch | 327/362 |

*Primary Examiner*—Timothy P. Callahan
*Assistant Examiner*—Jung Ho Kim
*Attorney, Agent, or Firm*—Robert D. Atkins

[57] ABSTRACT

A field programmable analog array cell (10) uses programmable impedance blocks (12, 18, 22, 24) in the feed-forward and feed-back paths of an amplifier (14) to set the overall function of the array. The impedance blocks use switches (34, 38, 42, 46) to program the desired impedance value. The switches induce leakage currents into the amplifier inputs which cause drift in the output voltage. A compensation circuit (28) providing a compensation current of opposite polarity to the leakage current to the same amplifier input to cancel its effects. Alternately, a compensation circuit (30) provides a compensation current having the same polarity as the leakage current to the opposite amplifier input to cancel its effects. A p-channel transistor (50) and n-channel transistor (54) are sized to one-half the total diffusion area of like semiconductor devices in the switching circuits.

19 Claims, 2 Drawing Sheets

5,493,246

CIRCUIT AND METHOD OF CANCELING LEAKAGE CURRENT IN AN ANALOG ARRAY

BACKGROUND OF THE INVENTION

The present invention relates in general to analog arrays and, more particularly, to leakage current compensation in the analog array.

Analog circuits are used in a variety of applications for providing functions such as filters, gains stages, analog-digital converters, etc. In the past, analog circuits have been generally designed for custom applications with a fixed amplifier stage and dedicated passive and/or active elements in the feed-forward and feed-back paths to perform the desired function. Each new circuit application typically requires a new design phase and layout phase which is a time consuming and expensive undertaking.

To bring products to market more efficiently, field programmable analog arrays have been developed to allow flexible implementations of analog functions. A typical field programmable analog array includes a fixed amplifier with programmable switched capacitor banks on its input terminals and feedback paths. The user need only program the switches to set the impedance values as needed to perform the analog function.

A common problem associated with switched impedance type field programmable arrays is the large number of switches needed to perform a useful function and the associated leakage current into the input terminals of the amplifier due to the large number of switches. The leakage current originates from the diffusion area of the switch contacts. Any leakage current introduced into the input terminals of the amplifier causes a voltage drift at the output of the amplifier. The diffusion current varies with process and increases with temperature thereby adding to the problem.

Hence, a need exists to minimize leakage current into the input terminals of the amplifier or any charge storage node associated with the field programmable analog array.

DETAILED DESCRIPTION OF THE PREFERRED EMBODIMENT

Figure 1:
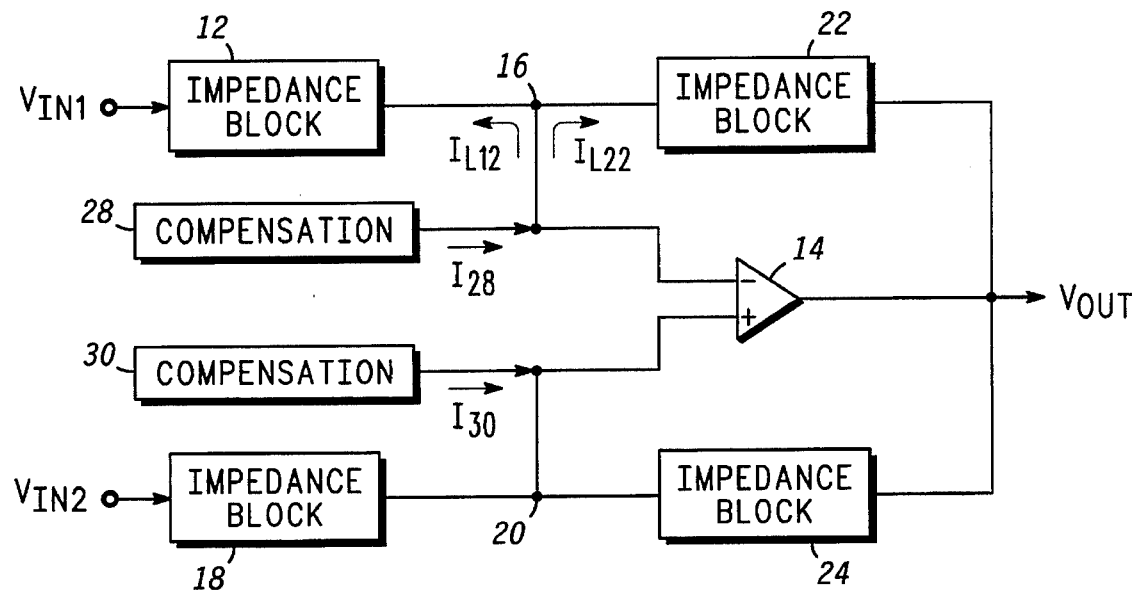
FIG. 1 is a block diagram illustrating a single cell of a field programmable analog array.

Referring to FIG. 1, a field programmable analog array cell 10 is shown suitable for manufacturing as an integrated circuit using conventional integrated circuit processes. An analog input signal $V_{IN1}$ is applied to impedance block 12 that includes passive circuit elements such as capacitors serially and parallel coupled through a switching array to the inverting input of differential amplifier 14 at node 16. An analog input signal $V_{IN2}$ is applied to impedance block 18 that also includes a plurality of passive circuit elements such as capacitors coupled through a serial and parallel network of switches to the non-inverting input of amplifier 14 at node 20. An impedance block 22 is coupled between the output of amplifier 14 and its inverting input. Similarly, impedance block 24 is coupled between the output of amplifier 14 and its non-inverting input. Impedance blocks 12, 18, 22, and 24 are programmed to close the appropriate switches to provide a predetermined function in response the input signals $V_{IN1}$ and $V_{IN2}$ to yield an analog signal $V_{OUT}$.

Field programmable analog array cell 10 provides flexibility in design where the user may program the setting of switching circuits in the impedance blocks to achieve the appropriate impedance in the feed-forward and feed-back paths necessary to configure the amplifier according to the desired function. Typically, many array cells are interconnected to form a complete analog array. The analog array may be fine-tuned, for example during test or field re-calibration, by changing the switch settings to adjust impedance values around the amplifier.

Figure 2:
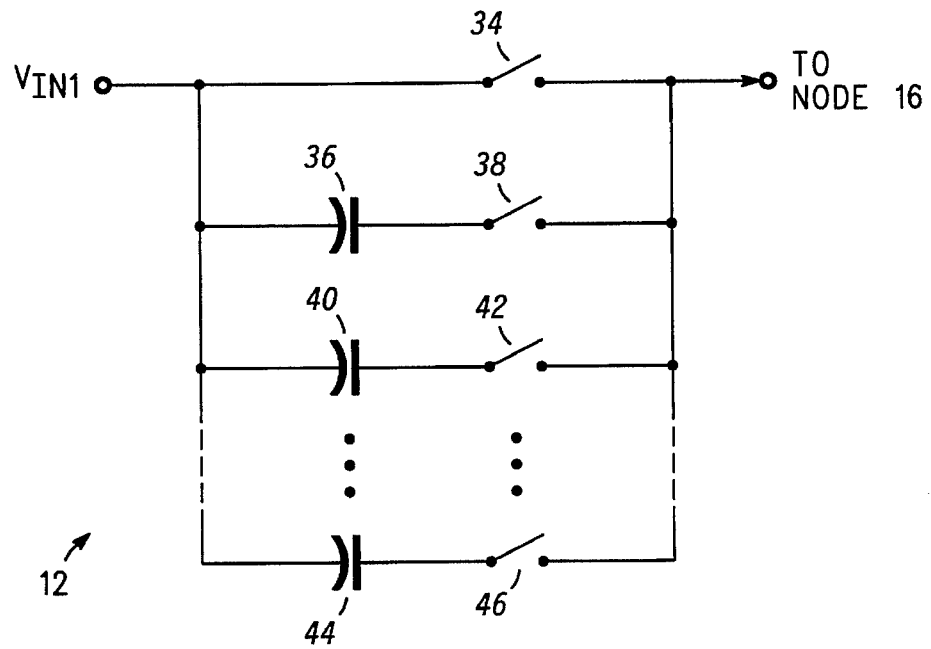
FIG. 2 illustrates a simplified embodiment of an impedance block of FIG. 1.

Turning to FIG. 2, a simplified embodiment of impedance block 12 is shown including switching circuit 34 coupled between the input signal $V_{IN1}$ and node 16. Capacitor 36 and switching circuit 38 are serially coupled between the input signal $V_{IN1}$ and node 16. Capacitor 40 and switching circuit 42 are serially coupled between the input signal $V_{IN1}$ and node 16, and capacitor 44 and switching circuit 46 are serially coupled between the input signal $V_{IN1}$ and node 16. The embodiment shown in FIG. 2 provides a simplified representation of the configuration of impedance block 12. It is understood that impedance block 12 typically contains many more switched capacitor elements, and other passive and/or active circuit elements, and a plurality of programmable switching circuits serially and parallel coupled to multiple input signals to provide flexibility in connecting a variety of cells to achieve the desired function. Impedance blocks 18, 22, and 24 also include passive and/or active circuit elements interconnected by a plurality of programmable switching circuits as described for impedance block 12 to achieve the desired function.

Switching circuit 34 may comprise p-channel and n-channel CMOS transistors (not shown) with their drains coupled together for receiving input signal $V_{IN1}$ and their sources coupled together to node 16. The gates of the p-channel and n-channel transistors receive complementary programming signals from a controller (not shown). Switching circuits 38, 42 and 46 are configured in a similar manner as described for switching circuit 34.

During normal operation, the source diffusion area of the p-channel and n-channel transistors of switching circuits 34, 38, 42 and 46 can source or sink a parasitic leakage current $I_{L12}$ into or away from the inverting input of amplifier 14. A similar leakage current $I_{L22}$ from impedance block 22 flows into or away from the inverting input of amplifier 14. The inverting and non-inverting inputs of amplifier 14 represent charge storage nodes within analog array cell 10 that are sensitive to charging and discharging by parasitic leakage currents. The large number of switches in impedance blocks 12, 18, 22, and 24' can create leakage currents of sufficient magnitude into the inverting and non-inverting inputs of amplifier 14 to cause an undesirable drift in the output voltage $V_{OUT}$.

As part of the present invention, compensation circuit 28 is coupled to node 16 at the inverting input of amplifier 14 for sourcing or sinking a compensation current $I_{28}$ into or away from node 16 that is substantially equal to the summation of leakage currents $I_{L12}$ and $I_{L22}$, say 10.0 nanoamps.

The compensation current $I_{28}$ has an opposite polarity with respect to the leakage current $I_{L12}$ and $I_{L22}$ so as to cancel their effect. That is, compensation circuit 28 draws a current away from node 16 equal to leakage currents flowing into the node such that no leakage current flows into the inverting input of amplifier 14 which in turn minimizes any drift in the output signal $V_{OUT}$. Alternately, compensation circuit 28 may source a current into node 16 equal to leakage currents flowing away from that node such that a net zero current flows into node 16.

Figure 3:
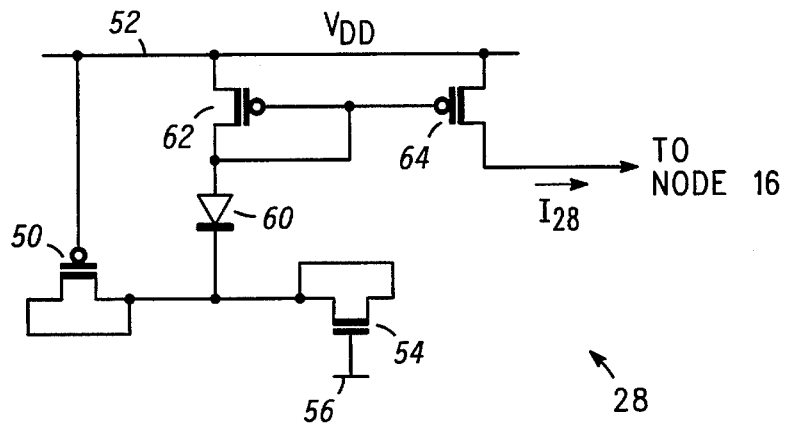
FIG. 3 is a schematic diagram illustrating the first compensation circuit of FIG. 1.

Further detail of compensation circuit 28 is shown in FIG. 3 including transistor 50 having a gate coupled to power supply conductor 52 operating at a positive potential $V_{DD}$ such as 5.0 volts. The drain and source of transistor 50 are coupled together for providing a source of leakage current. Although the high potential at power supply conductor 52 keeps transistor 50 from operating in its normal mode, the source and drain diffusion area still cause a leakage current of say 2.0 nanoamps to flow. The source and drain diffusion area of transistor 50 is sized to one-half the total diffusion areas of the p-channel transistors in the switches of impedance blocks 12 and 22. For example, if the source diffusion area of the p-channel transistors of switching circuits 34, 38, 42 and 46 are sized to 50.0 microns of width each, then transistor 50 is sized to 100.0 microns of width, i.e. 0.5×4× 50.

Compensation circuit 28 further includes transistor 54 having a gate coupled to power supply conductor 56 operating at ground potential. The drain and source of transistor 54 are coupled together for providing another source of leakage current. Although the low potential at power supply conductor 56 keeps transistor 54 from operating in its normal mode, the source and drain diffusion area still sink a leakages current of say 12.0 nanoamps. Transistor 54 is sized to have a source and drain diffusion area that is one-half the sum total of the diffusion areas of the n-channel transistors that comprise the switching circuits of impedance blocks 12 and 22. For example, if the source diffusion area of the n-channel transistors of switching circuits 34, 38, 42 and 46 are sized to 50.0 microns of width each, then transistor 54 is sized to 100.0 microns of width, i.e. 0.5×4× 50.

The sum of the diffusion areas of the p-channel transistors in the switching circuits are equal to the diffusion area of p-channel transistor 50, while the sum of the diffusion areas of the n-channel transistors of the switching circuits equal to the diffusion area of n-channel transistor 54. The use of like semiconductor material assures process and temperature independence for the leakage current compensation. Since only the source side of the n-channel and p-channel transistors of the switching circuits of impedance blocks 12 and 22 are coupled to node 16, transistors 50 and 54 are sized to one-half the total size of all the diffusion areas of the switching circuits that coupled to node 16.

The common diffusion area of transistors 50 and 54 is coupled to the cathode of diode 60 for providing a similar bias voltage as seen by the switching circuits in impedance blocks 12 and 22. The anode of diode 60 is coupled to the drain and gate of transistor 62. The source of transistor 62 is coupled to power supply conductor 52. The drain and gate of transistor 62 is further coupled to the gate of transistor 64 for providing a current mirror operation to steer the leakage compensation current to node 16. The source of transistor 64 is coupled to power supply conductor 52 while its drain is coupled to node 16. The current flowing through transistor 62 and diode 60 is determined by the leakage currents of transistors 50 and 54. Transistor 50 sources 2.0 nanoamps of leakage current while transistor 54 sinks 12.0 nanoamps of leakage current. That leaves 10.0 nanoamps flowing through diode 60 and transistor 62. That same leakage current is mirrored in transistor 64 and flows into node 16 as compensation current $I_{28}$ to cancel leakage currents $I_{L12}$ and $I_{L22}$. At this current level, transistors 62 and 64 are operating in the weak inversion mode typical of battery operated devices such as digital watches. Diode 60 and transistors 62 and 64 also generate a small amount of parasitic leakage and must be taken into account in sizing transistors 50 and 54 to match the sum total of leakage currents from impedance blocks 12 and 22.

In an alternate embodiment, the diffusion areas of transistors 50 and 54 may be ratioed smaller to that of the sum total of diffusion areas of the switching circuits of impedance blocks 12 and 22. The smaller ratio may be necessary because of size restrictions on the integrated circuit die. In such case, the current mirror circuit 62–64 is ratioed to provide the proper compensation current $I_{28}$ to cancel the leakage currents $I_{L12}$ and $I_{L22}$. For example, if transistors 50 and 54 are reduced in size by a factor of five then transistor 64 is sized to have a width five times that of transistor 62.

Figure 4:
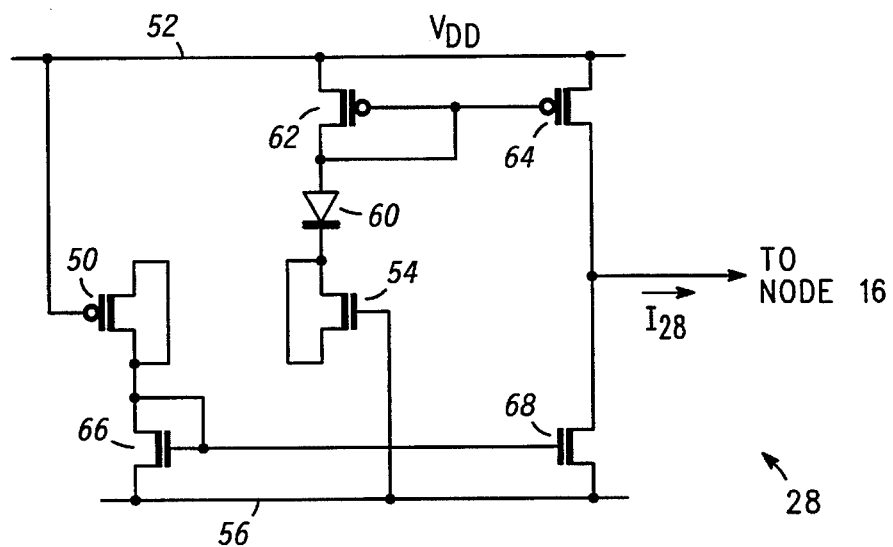
FIG. 4 illustrates an alternate embodiment of the first compensation circuit of FIG. 1.

Turning to FIG. 4, an alternate embodiment of compensation circuit 28 is shown. Components having a similar function are assigned the same reference numbers used in FIG. 3. An additional current mirror circuit comprising transistors 66 and 68 provides an alternate technique of steering the leakage compensation current. Transistor 66 includes a drain and gate coupled together to the source and drain diffusion area of transistor 50, and a source coupled to power supply conductor 56. The gate of transistor 68 is coupled to the gate and drain of transistor 66, while its source is coupled to power supply conductor 56. The drain of transistor 68 is coupled to node 16. Transistor 50 provides a leakage current of say 2.0 nanoamps into the current mirror arrangement 66–68. Transistor 54 conducts 12.0 nanoamps of leakage current through diode 60 and transistor 62 which in turn is mirrored in transistor 64. With transistor 64 conducting 12.0 nanoamps and transistor 68 conducting 2.0 nanoamps of current, a net 10.0 nanoamps of compensation current $I_{28}$ flows into node 16 to cancel the leakage currents $I_{L12}$ and $I_{L22}$ from impedance blocks 12 and 22, respectively. Transistors 66 and 68 operate in the weak inversion mode for low current operation.

As another part of the present invention, compensation circuit 30 provides an alternate approach to compensating for leakage. currents $I_{L12}$ and $I_{L22}$ by injecting a compensation current $I_{30}$ of the same polarity and magnitude as the sum of leakage currents $I_{L12}$ and $I_{L22}$ into node 20 at the non-inverting input of amplifier 14. The inverting input of amplifier 14 receives the same amount of leakage current as the non-inverting input and therefore drift together as a common mode signal causing the output voltage $V_{OUT}$ to stay constant. That is, the identical leakage currents into the inverting and non-inverting inputs of amplifier 14 are rejected by the differential operation of amplifier 14. Compensation circuit 30 thus provides compensation of any leakage current into the inverting input of amplifier 14 to minimize drift in the output voltage $V_{OUT}$.

Figure 5:
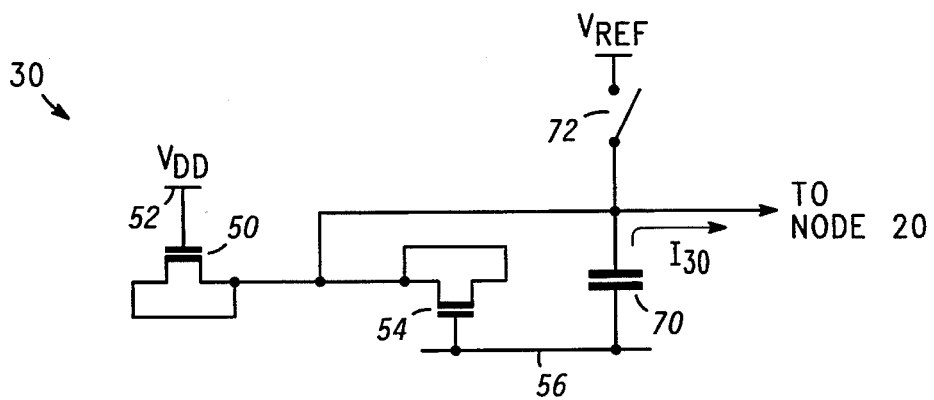
FIG. 5 is a schematic diagram illustrating the second compensation circuit of FIG. 1.

Referring now to FIG. 5, compensation circuit 30 is shown with transistors 50 and 54 configured as described in FIG. 3. The common diffusion area of transistors 50 and 54 is coupled to node 20. Capacitor 70 is coupled between node 20 and power supply conductor 56. Capacitor 70 is selected at a value equal to the total capacitance between node 16 and the output of amplifier 14. A reference potential $V_{REF}$ operating at the midway point between power supply conductors 52 and 56 (2.5 volts) is coupled through switching circuit 72 to node 20. In a switch capacitor arrangement of impedance blocks 12 and 22, the internal switching circuits operate at predetermined phases of a clock signal to store and transfer charge from the input of the amplifier to its output. Switching circuit 72 is closed at the beginning of the charge phase to charge node 20 to reference voltage $V_{REF}$. Switching circuit 72 opens at the beginning of the transfer phase whereby transistors 50 and 54 supply a leakage current that changes the voltage across capacitor 70 in the same manner as leakage currents $I_{L12}$ and $I_{L22}$ change the voltage at the inverting input of amplifier 14. Thus, the inverting and non-inverting inputs of amplifier 14 receive the same change in voltage in a common mode manner that is canceled by the differential operation of amplifier 14. The leakage current cancellation removes any drift of the output voltage $V_{OUT}$ attributed to leakage currents from impedance blocks 12 and 22.

By now it should be appreciated that the present invention provides compensation of leakage current at the inputs of an amplifier, or any other charge storage node, in an analog array. Field programmable analog arrays provide flexibility in design where the user may program the setting of switching circuits in the impedance blocks to effect the appropriate impedance in the feed-forward and feed-back paths to configure the amplifier according to the desired function. The large number of switches needed to program the impedance block and generate the proper response induce undesirable leakage currents. The compensation current cancels the leakage currents to prevent drift in the output voltage of the analog array.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An analog circuit, comprising:

an amplifier having first and second inputs and an output, said first input being coupled for receiving a first input signal, said output providing an output signal;

circuit means coupled between a terminal at which a second input signal is applied and said second input of said amplifier for providing a programmable impedance, said circuit means including a plurality of switches to control said programmable impedance; and a compensation circuit coupled to said second input of said amplifier for providing a compensation current that cancels leakage current from said circuit means into said second input of said amplifier and prevents drift in said output signal of said amplifier.

2. The analog circuit of claim 1 wherein said compensation circuit includes:

a source of leakage current; and current steering means having an input coupled to said source of leakage current and having an output for providing said compensation current to said second input of said amplifier.

3. The analog circuit of claim 2 wherein said source of leakage current includes a first transistor having a gate, a drain and a source, said gate being coupled to a first power supply conductor that renders said first transistor non-operational, said source being coupled to said drain for generating a first component of said compensation current, said first transistor having source and drain diffusion areas sized with respect to diffusion areas of like semiconductor material in said plurality of switches in said circuit means for providing said first component of said compensation current.

4. The analog circuit of claim 3 wherein said source of leakage current further includes a second transistor having a gate, a drain and a source, said gate being coupled to a second power supply conductor that Fenders said second transistor non-operational, said source being coupled to said drain for generating a second component of said compensation current, said second transistor having source and drain diffusion areas sized with respect to diffusion areas of like semiconductor material in said plurality of switches in said circuit means for providing said second component of said compensation current that in combination with said first component of said compensation current cancels said leakage current from said circuit means.

5. The analog circuit of claim 2 wherein said current steering means includes a current mirror circuit having an input coupled to said source of leakage current and having an output for providing said compensation current.

6. The analog circuit of claim 5 wherein said current mirror circuit includes:

a first transistor having a gate, a drain and a source, said source being coupled to a first power supply conductor, said gate and drain being coupled together to said source of leakage current; and a second transistor having a gate, a drain and a source, said source being coupled to said first power supply conductor, said gate being coupled to said gate and drain of said first transistor, said drain providing said compensation current to said second input of said amplifier.

7. The analog circuit of claim 6 wherein said current steering means further includes a diode coupled between said source of leakage current and said drain of said first transistor.

8. The analog circuit of claim 1 wherein said compensation circuit includes:

a first source of leakage current;

a second source of leakage current; and current steering means having first and second inputs coupled to said first and second sources of leakage current respectively and having an output for providing said compensation current.

9. The analog circuit of claim 8 wherein said first source of leakage current includes a first transistor having a gate, a drain and a source, said gate being coupled to a first power supply conductor that renders said first transistor non-operational, said source being coupled to said drain for generating a first component of said compensation current, said first transistor having source and drain diffusion areas sized with respect to diffusion areas of like semiconductor material in said plurality of switches in said circuit means for providing said first component of said compensation current.

10. The analog-circuit of claim 9 wherein said second source of leakage current includes a second transistor having a gate, a drain and a source, said gate being coupled to a second power supply conductor that renders said second transistor non-operational, said source being coupled to said drain for generating a second component of said compensation current, said second transistor having source and drain diffusion areas sized with respect to diffusion areas of like semiconductor material in said plurality of switches in said circuit means for providing said second component of said compensation current that in combination with said first component of said compensation current cancels said leakage current from said circuit means.

11. The analog circuit of claim 10 wherein said current steering means includes:

a first current mirror circuit having an input coupled to said first source of leakage current and having an output coupled to said second input of said amplifier; and a second current mirror circuit having an input coupled to said second source of leakage current and having an output coupled to said second input of said amplifier for providing said compensation current.

12. The analog circuit of claim 11 wherein said first current mirror circuit includes:

a first transistor having a gate, a drain and a source, said source being coupled to said first power supply conductor, said gate and drain being coupled together to said first source of leakage current; and a second transistor having a gate, a drain and a source, said source being coupled to said first power supply conductor, said gate being coupled to said gate and drain of said first transistor, said drain providing said first component of said compensation current to said second input of said amplifier.

13. The analog circuit of claim 12 wherein said second current mirror circuit includes:

a third transistor having a gate, a drain and a source, said source being coupled to said second power supply conductor, said gate and drain being coupled together to said second source of leakage current; and a fourth transistor having a gate, a drain and a source, said source being coupled to said second power supply conductor, said gate being coupled to said gate and drain of said third transistor, said drain providing said second component of said compensation current to said second input of said amplifier.

14. An analog circuit, comprising:

an amplifier having first and second inputs and an output, said first input being coupled for receiving a first input signal, said output providing an output signal;

circuit means coupled between a terminal at which a second input signal is applied and said second input of said amplifier for providing a programmable impedance, said circuit means including a plurality of switches to control said programmable impedance; and a compensation circuit coupled to said first input of said amplifier for providing a compensation current that matches leakage current from said circuit means into said second input of said amplifier and prevents drift in said output signal of said amplifier.

15. The analog circuit of claim 14 wherein said compensation circuit includes:

a source of leakage current;

a capacitor coupled between said first input of said amplifier and a first power supply conductor; and a switching circuit coupled between a terminal at which a reference voltage is applied and said first input of said amplifier.

16. The analog circuit of claim 15 wherein said capacitor is sized to match total capacitance that connects between said output of said amplifier and said first input of said amplifier.

17. The analog circuit of claim 16 wherein said source of leakage current includes a first transistor having a gate, a drain and a source, said gate being coupled to a first power supply conductor that renders said first transistor non-operational, said source being coupled to said drain for generating a first component of said compensation current, said first transistor having source and drain diffusion areas sized with respect to diffusion areas of like semiconductor material in said plurality of switches in said circuit means for providing said first component of said compensation current.

18. The analog circuit of claim 17 wherein said source of leakage current further includes a second transistor having a gate, a drain and a source, said gate being coupled to a second power supply conductor that fenders said second transistor non-operational, said source being coupled to said drain for generating a second component of said compensation current, said second transistor having source and drain diffusion areas sized with respect to diffusion areas of like semiconductor material in said plurality of switches in said circuit means for providing said second component of said compensation current that in combination with said first component of said compensation current cancels said leakage current from said circuit means.

19. A method of compensating for leakage current in an analog circuit, comprising the steps of:

providing a differential amplifier having first and second inputs;

providing a parasitic leakage current into said first input of said differential amplifier; and injecting a compensation current into said second input of said differential amplifier that matches said parasitic leakage current and cancels effects of said parasitic leakage current by creating a common mode signal that is rejected by said differential amplifier.

* * * * *

UNITED STATES PATENT AND TRADEMARK OFFICE
CERTIFICATE OF CORRECTION

PATENT NO. : 5,493,246
DATED : February 20, 1996
INVENTOR(S) : David J. Anderson It is certified that error appears in the above-indentified patent and that said Letters Patent is hereby corrected as shown below:

In Claim 4, column 6, line 8, delete "Fenders" and insert --renders-- therefor.

In Claim 8, column 8, line 26, delete "finders" and insert --renders-- therefor.

Signed and Sealed this

Twenty-fourth Day of June, 1997

Attest:

BRUCE LEHMAN

Attesting Officer

Commissioner of Patents and Trademarks